BONDING A BEAM LEADED DEVICE TO A SUBSTRATE

Original Filed June 15, 1967

INVENTOR
J. A. SANTANGINI

By R. P. Miller
ATTORNEY

BONDING A BEAM LEADED DEVICE TO A SUBSTRATE

Original Filed June 15, 1967 5 Sheets-Sheet

Nov. 4, 1969 J. A. SANTANGINI 3,475,814

BONDING A BEAM LEADED DEVICE TO A SUBSTRATE

Original Filed June 15, 1967 5 Sheets-Sheet 3

Nov. 4, 1969 J. A. SANTANGINI 3,475,814

BONDING A BEAM LEADED DEVICE TO A SUBSTRATE

Original Filed June 15, 1967 5 Sheets-Sheet 4

United States Patent Office 3,475,814

Patented Nov. 4, 1969

3,475,814

BONDING A BEAM LEADED DEVICE TO A SUBSTRATE

Joseph A. Santangini, Bethlehem, Pa., assignor to Western Electric Company, Incorporated, New York, N.Y., a corporation of New York Original application June 15, 1967, Ser. No. 646,325, now Patent No. 3,442,432, dated May 6, 1969. Divided and this application Aug. 26, 1968, Ser. No. 774,554

Int. Cl. B23k *31/02;* B01j *17/00*

U.S. Cl. 29—589 3 Claims

ABSTRACT OF THE DISCLOSURE

In simultaneously bonding the leads of a beam-leaded device to conductive areas on a substrate, a bonding tool applies pressure and bonding energy to the leads. A movable ball located within a bore formed in a base which initially supports the substrate is raised into engagement with the substrate to lift and pivotally support the substrate above the base surface in equilibrium position where the bonding forces applied to each lead are equal.

This is a division of application Ser. No. 646,325, filed June 15, 1967, now U.S. Patent 3,442,432 issued May 6, 1969.

BACKGROUND OF THE INVENTION

In the manufacture of miniature semiconductor circuits, it is necessary to bond the leads of a beam-leaded device to metallized, conductive areas on a substrate. An example of a beam-leaded device is illustrated in an application by M. P. Lepselter, Ser. No. 388,039, filed on Aug. 7, 1964. There is a problem in establishing uniform bonding pressures on the leads of the beam-leaded device when the leads are simultaneously bonded to the conductive areas on the substrate. A typical beam-leaded integrated circuit is approximately 50 mils square and the leads extending from the device are 9 mils in length, 4 mils in width, and .5 mil in thickness. Each beam-leaded device has an array of such leads extending in cantilever fashion from the body of the device. In simultaneously bonding the array of leads to a similar array of conductive areas on a substrate, surface irregularities and variations in the thickness of the substrate result in nonuniform bonding pressure on each of the leads which produces nonuniform bonding between the leads and the conductive areas. Thus, in an apparatus for performing simultaneous bonding of the leads, it is desirable to compensate for nonuniform substrate thickness and for substrate surface irregularities.

In the prior art, bonding of a plurality of leads has been accomplished by using a bonding tool having a flat surface for simultaneously contacting leads. The substrate is supported upon a flat surface beneath the bonding tool and the leads are placed in desired positions upon the substrate. Then the bonding tool is moved into contact with the leads to apply bonding energy and pressure to the leads and the substrate. If the substrate does not have uniform thickness, the bonding tool exerts unequal bonding pressures upon the leads and nonuniform bonding results. In order to avoid this result, i.e. nonuniform bonding, the bonding apparatus must compensate for the lack of uniformity in the thickness of the substrate to exert equal bonding pressures upon each of the leads.

Thus, an apparatus for evenly distributing bonding forces over a plurality of workpieces which are simultaneously bonded is desirable. A bonding apparatus capable of receiving a multi-leaded device from a loading station and transferring the device to a bonding station where its leads are automatically and simultaneously bonded to conductors on a substrate is preferred.

SUMMARY OF THE INVENTION

The present invention contemplates methods of simultaneously bonding a plurality of workpieces, such as leads of a beam-leaded device, to a substrate. The bonding technique compensates for non-uniform thickness of the substrate to exert uniform bonding pressure on each of the workpieces. In the present invention, a bonding tool, having a bonding tip with a recessed portion surrounded by a rim, is used to apply bonding energy and pressure to a plurality of leads extending from a beam-leaded device. The beam-leaded device is placed in a desired position upon a substrate supported upon a base with the rim of the bonding tool contacting its leads. Bonding pressure is applied to the leads and the substrate by the bonding tool, and then the substrate is lifted from the surface of the base by a ball movably mounted within a recess in the base and normally located below the base surface and out of contact with the substrate. The substrate is thus pivotally supported on the ball away from the surface of the base and is free to pivot, under the pressure applied by the bonding tip, to an equilibrium position where the bonding pressures applied to each lead are equalized. In this manner, uniform bonding of each of the leads to the substrate is accomplished.

DESCRIPTION OF THE DRAWING

The purposes and advantages of the present invention will become apparent upon consideration of the following detailed description in conjunction with the accompanying drawing wherein.

DETAILED DESCRIPTION

Description of the apparatus

Figure 1:
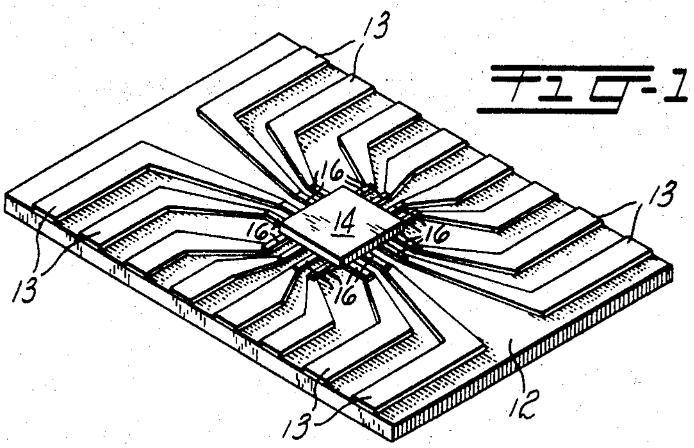
FIG. 1 illustrates a substrate having a plurality of conductive areas formed thereon to which the leads of a beam-leaded device are bonded.

FIG. 1 illustrates a miniature electronic circuit produced by the methods of the present invention. The circuit includes a substrate 12, such as a ceramic, upon which an array of thin-film conductive areas 13, composed of a metallic, such as a gold-titanium alloy, are formed. A beam-leaded device 14, in this example an integrated circuit having a planar array of leads 16 extending in cantilever fashion from the active areas of the device 14, is positioned at the center of the substrate 12 with its leads 16 in contact with the conductive areas 13. The leads 16 may be composed primarily of gold with a thin layer of platinum on their upper surfaces. The apparatus of the present invention is used to bond the leads 16 to the conductive areas 13.

Figure 2:
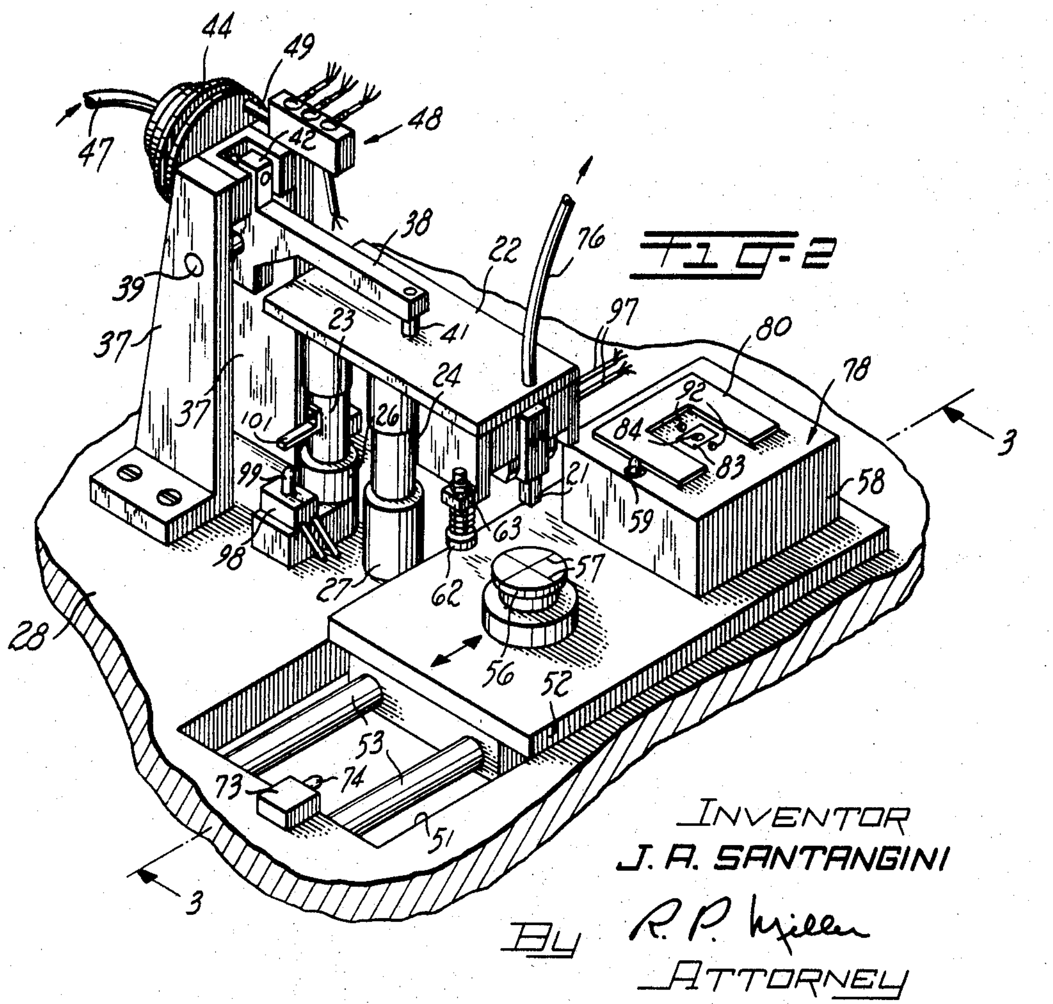
FIG. 2 is a perspective view of an apparatus for bonding the leads of the beam-leaded device to the conductive areas of the substrate shown in FIG. 1.
Figure 4:
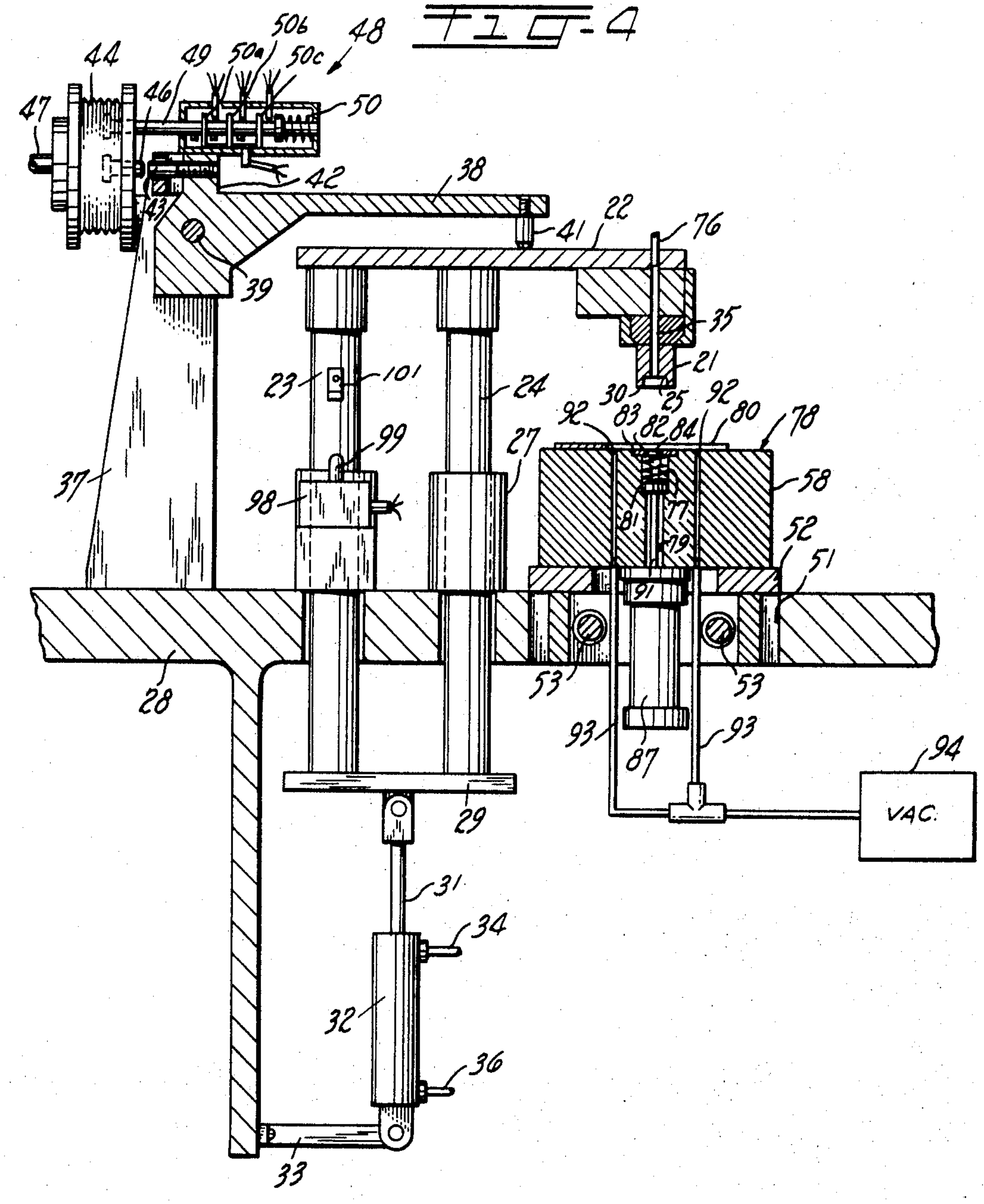
FIG. 4 is a side view of the bonding apparatus, partially in section, taken along line 4—4 of FIG. 3, showing a set of bellows which are used to apply bonding pressure to the bonding tip, a pressure responsive switch connected to the bellows, and an air cylinder and piston arrangement for moving the bonding tool toward and away from the base.
Figure 5:
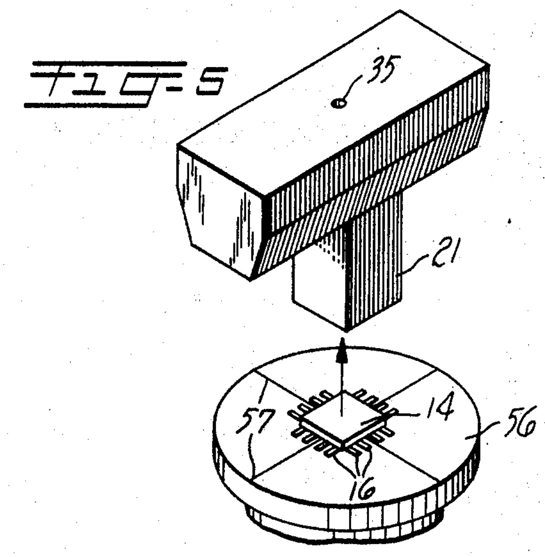
FIG. 5 is a perspective view of the bonding tip and the beam-leaded device prior to the application of a vacuum to the bonding tip for picking up the beam-leaded device.

In FIG. 2 a bonding apparatus is shown which includes a bonding tool 21 of stainless steel, carbide, or other suitable material, mounted in a movable support 22. The support 22 is mounted upon a pair of rods 23 and 24 which are received in a pair of bearings 26 and 27 and extend through openings in a frame 28 of the apparatus. As shown in FIG. 4, the rods 23 and 24 are connected to a bracket 29 which, in turn, is connected to a piston rod 31 extending from an air cylinder 32. The air cylinder 32 is connected by a bracket 33 to the frame 28. Pressurized air is applied to the air cylinder 32 through a pair of flexible hoses 34 and 36 to impart vertical motion to the support 22 and the bonding tool 21.

A pair of vertical supports 37 are mounted to the frame 28 adjacent to the rods 23 and 24. An arm 38 is pivotally mounted to the supports 37 by a shaft 39. The arm 38 terminates at one end over the support 22 and has a pressure applying pin 41 which bears against the top surface of the support 22. The arm 38 also has a projecting portion 42 which extends in a vertical direction therefrom. A force transmitting pin 43 is connected to the projecting portion 42.

A set of bellows 44 is mounted to the supports 37 and has a movable pin 46 projecting from its front end and in alignment with the pin 43. A flexible hose 47 is connected to the other end of the bellows 44. Pressurized air is applied to the interior of the bellows 44 through the hose 47 to move the pin 46 forward into engagement with the pin 43 to pivot the arm 38 downward to exert a pressure upon the movable support 22. As shown in FIGS. 2 and 4, a pressure responsive switch 48, mounted on one of the supports 37, has a plunger 49 which extends into the bellows 44.

Figure 3:
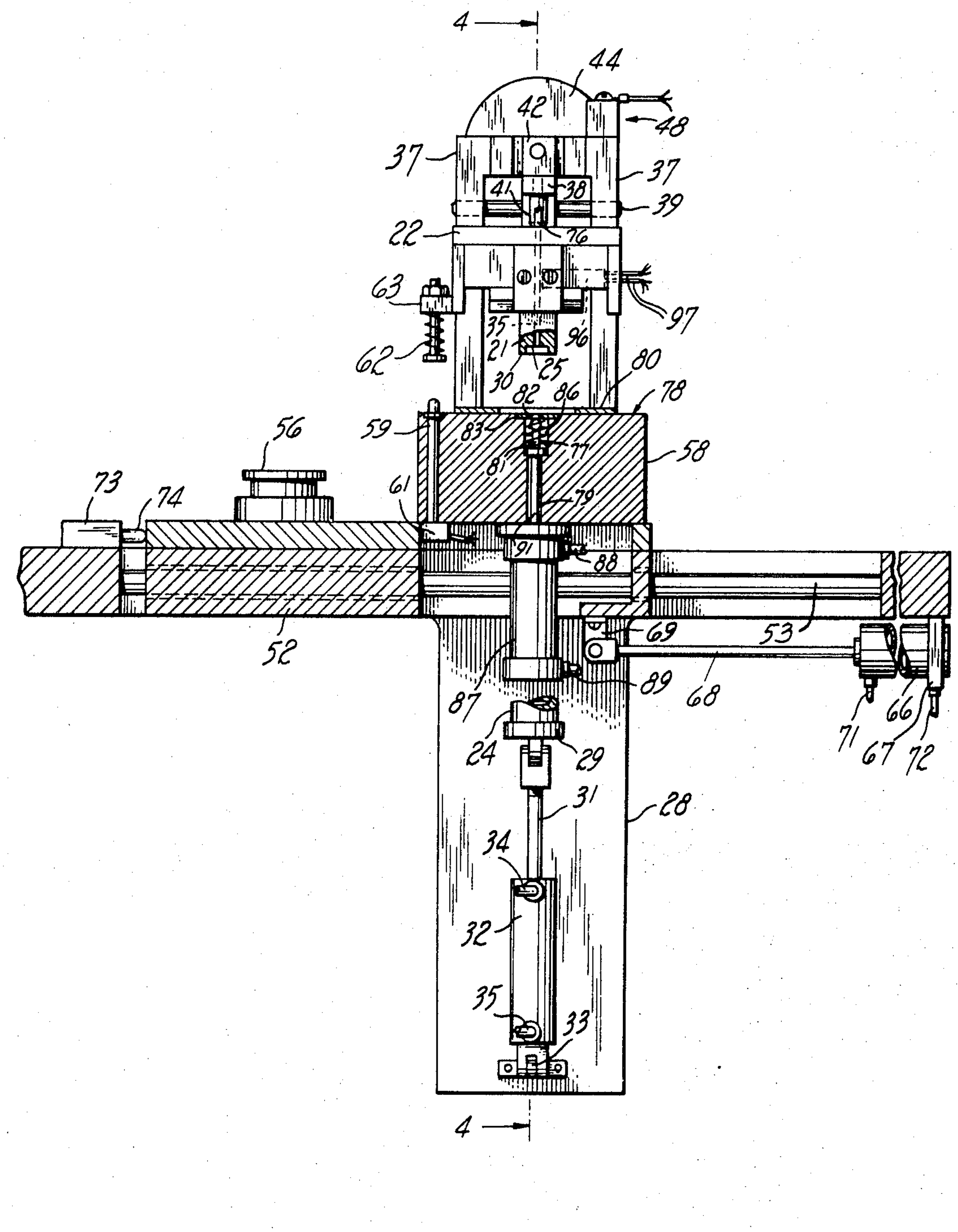
FIG. 3 is a front view of the bonding apparatus of FIG. 2, partially in section, taken along line 3—3 of FIG. 2, illustrating a bonding tip having a recessed portion for receiving a body of the beam-leaded device and a base for supporting the substrate, with a counterbore formed in the surface of the base in which a ball is movably mounted.

As shown in FIG. 2, a rectangular opening 51 is formed in the frame 28 beneath the bonding tool 21. A carriage 52 is positioned within the opening 51 and is slidably supported upon a pair of guide rods 53 which are connected to the frame 28. A work loading support 56, having a flat surface with a pair of intersecting lines 57 defining its center, is mounted on the carriage 52 in a position such that when the carriage 52 is located in its extreme rightward position (FIG. 2), the center of the work support 56 is located directly below the bonding tool 21. A second work support or base 58 is mounted upon the carriage 52 in such a position that when the carriage 52 is moved to its extreme leftward position, the center of the base 58 is located beneath the bonding tool 21. A plunger 59 extending through the base 58 is connected to a switch 61 mounted on the bottom side of the base 58 (FIG. 3). The plunger 59 is operated by a spring-biased plunger 62 connected to the movable support 22 by a bracket 63. When the bonding tool 21 is lowered into contact with a substrate positioned upon the support 58, the switch 61 is operated to initiate the application of bonding pressure to the bonding tool 21.

Referring to FIG. 3, an air cylinder 66 mounted to the frame 28 by a bracket 67 has a piston rod 68 extending from its front end which is conneced by a bracket 69 to the carriage 52. Pressurized air is applied to the air cylinder 66 through a pair of flexible hoses 71 and 72 to move the carriage 52 along the guide rods 53. A switch 73 having a plunger 74 extending from its front end is mounted on the frame 28 adjacent to the opening 51 to the left of the carriage 52. The plunger 74 is operated by the carriage 52 when it is located in its extreme leftward position to control the downward movement of the bonding tool 21.

As shown in FIG. 3, the bonding tool 21 has a recessed portion 25 formed at its bonding tip. The recessed portion 25 receives a beam-leaded device 14 and is surrounded by a rim 30 which contacts the upper surfaces of the leads 16 of the beam-loaded device 14 at their exterior ends and exerts bonding pressures thereon. A passageway 35 extends from the recessed portion 25 through the bonding tool 21 to a flexible hose 76 to which a vacuum is applied to pick up the beam-leaded device 14 from the work support 56.

The base 58 has a counterbore 77 formed therein and extending in a downward direction from its top surface 78. A passageway or bore 79 extends from the bottom portion of the counterbore 77 completely through the base 58. A plunger 81 which supports a small diameter, metallic ball 82 is slidably received in the counterbore 77. A spring retainer plate 83, having a central opening 84, is fitted into a shallow rectangular depression in the top surface 78 of the base 58. A locator plate 80, having a rectangular cutout portion for receiving the substrate 12, is mounted on the top surface 78. A compression spring 86 is located between the retainer plate 83 and the plunger 81 to urge the plunger 81 in a downward direction so that the ball 82 is normally below the top surface 78 of the base 58. An air cylinder 87 having a pair of flexible hoses 88 and 89 is mounted to the bottom of the base 58. The air cylinder 87 has a piston rod 91 extending into the bore 79 and in contact with a bottom surface of the plunger 81. Pressurized air is applied to the air cylinder 87 through the flexible hoses 88 and 89 to move the piston rod 91 vertically to raise and lower the plunger 81 and ball 82.

The base 58 is also provided with a pair of passages 92 (FIG. 4) which extend from the top surface 78 completely through the base 58. A pair of flexible hoses 93 are connected to the passages 92 and are coupled to a vacuum source 94. A suction force is applied to a substrate positioned on the top surface 78 over the passages 92 by operation of the vacuum source 94.

As shown in FIG. 3, a heating cartridge 96 is located within the support 22 and in contact with the bonding tool 21. Electrical energy is applied to a pair of leads 97 (FIG. 2) connected to a resistance heater within the cartridge 96 to apply bonding energy in the form of heat to the bonding tool 21.

A switch 98 (see FIG. 2) having a plunger 99 extending in a vertical direction is mounted on the frame 28 beneath the support 22. The plunger 99 is operated by an arm 101 projecting from the rod 23. Thus, the switch 98 responds to downward movement of the support 22 and the bonding tool 21 to operate a timing motor 107 (FIG. 11) which controls the application of a vacuum to the passageway 35.

Control circuit

Figure 11:
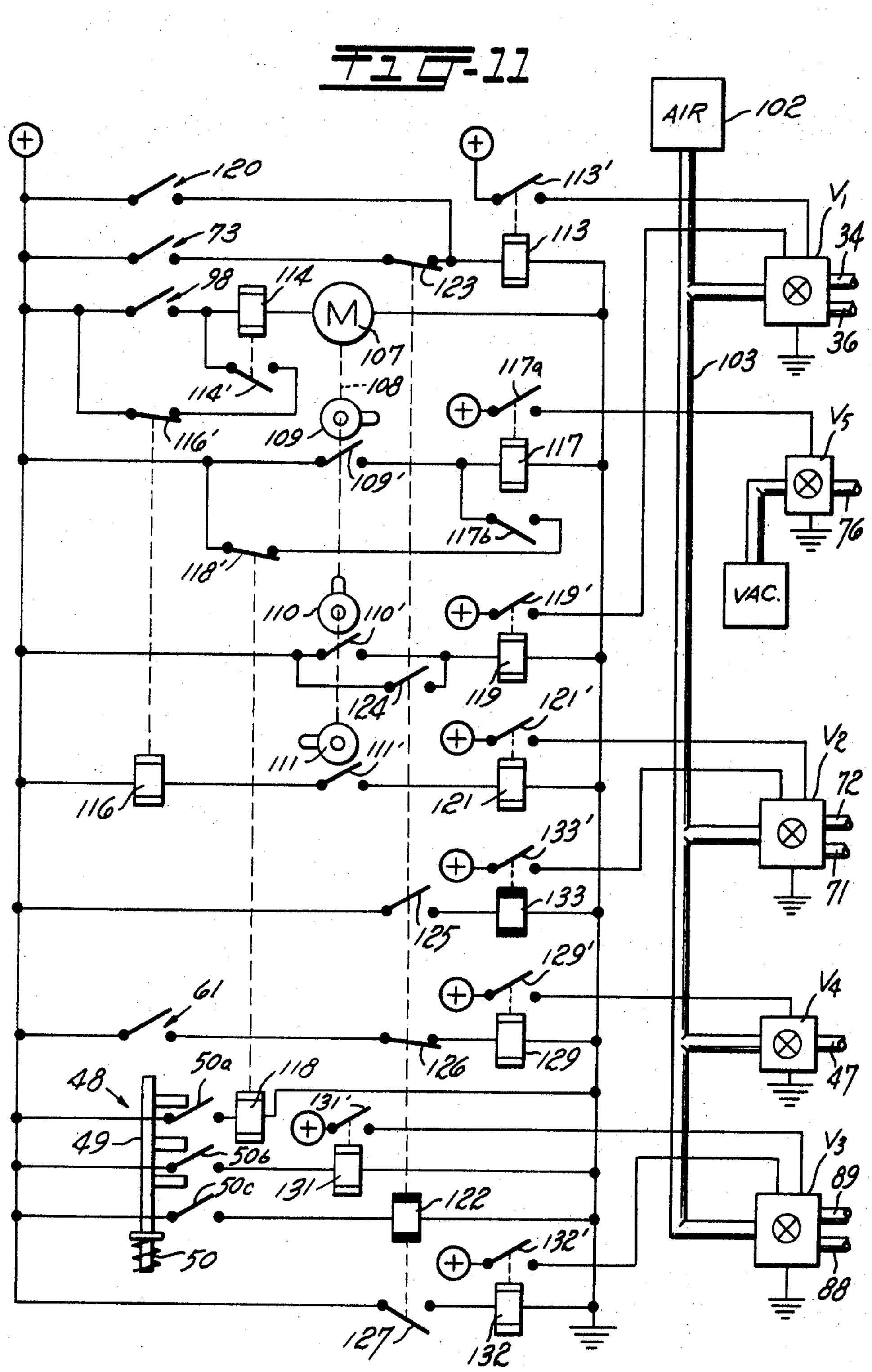
FIG. 11 is a schematic diagram of an electro-mechanical control circuit for operating the bonding apparatus illustrated in FIGS. 2–4.

FIG. 11 illustrates a circuit for carrying out the method of the present invention. The circuit includes a plurality of four-way solenoid valves V1–V3 which are connected to a source 102 of pressurized air through a common line 103. The valve V1 directs pressurized air to the air cylinder 32 to control the vertical movement of the bonding tool 21. Pressurized air is supplied to the air cylinder 66 by the valve V2 to move the carriage 52 horizontally. Valve V3 operates the air cylinder 87 to raise and lower the ball 82. The circuit also includes a solenoid valve V4 connected to the common line 103 for applying pressurized air to the bellows 44. A solenoid valve V5 is connected to the vacuum source 94 (FIG. 4) by a flexible hose 104 and is used to apply a vacuum to the passageway 35.

A timing motor 107 having a shaft 108 upon which three timing cams 109, 110, and 111 are mounted is provided for operating the solenoid valves V5, V1, and V2 in sequence when the switch 98 is closed by downward movement of the bonding tool 21.

Operation

In using the carrying out the method of the present invention to bond the leads of a beam-leaded device to metallic or semiconductive areas on a substrate, a substrate 12 is positioned on the top surface 78 of the base 58 within the cutout portion of the locator plate 80 and overlying the central opening 84 and the passages 92. A vacuum is continuously applied to the passages 92 from the vacuum source 94 to hold the substrate 12 against the top surface 78.

Next, a beam-leaded device 14 is positioned at the center of the work support 56 which is determined by the intersecting lines 57. At this time, assume that the carriage 52 is in its extreme rightward position, as illustrated in FIG. 2, so that the bonding tool 21 is directly above the work support 56 and in alignment with the beam-leaded device 14. A start switch 120 (FIG. 11) is momentarily closed to complete a circuit from a potential source through a relay 113 to ground. The relay 113 is thus energized to close an associated contact 113' to energize the solenoid controlled valve V1, from another potential source, such that pressurized air is applied to the air cylinder 32 (FIG. 4) through the flexible hose 34 from the source 102 of pressurized air. The piston rod 31 is drawn into the air cylinder 32, moving the rods 23 and 24 and the support 22 in a downward direction. The bonding tool 21 moves toward the beam-leaded device 14 on the work support 56 and when the bonding tool 21 reaches a predetermined distance (e.g. 1/16 inch) above the surface of the work support 56, the plunger 99 is depressed sufficiently by the arm 101 extending from the rod 23 to close the switch 98.

As shown in FIG. 11, the closure of the switch 98 energizes the timing motor 107 through a relay 114. The relay 114 closes an associated contact 114' to lock itself into an operated condition as long as a contact 116' associated with a relay 116 is closed. The motor 107 also operates for the same period of time as the relay 114 and begins to rotate the shaft 108. The cam 109 is first to close an associated switch 109' which energizes a relay 117. The relay 117 closes an associated contact **117*a* to operate the solenoid valve V5. Relay 117 also closes a contact 117*b* to lock itself in an operated condition through a circuit including a normally closed contact 118'. Operation of solenoid valve V5 results in a vacuum being applied to the passageway 35 through the flexible hose 76 as the bonding tool 21 is moved over the beam-leaded device 14 to pick up the beam-leaded device 14 and to hold it within the recessed portion 25. The depth of the recess 25 is greater than the thickness of the beam-leaded device 14 so that it is held in a suspended position therein with the upper surfaces of its leads 16 firmly engaged by the bonding rim 30**.

Next, the timing cam 110 closes an associated switch 110' to operate a relay 119. The relay 119 closes its associated contact 119', thereby operating the solenoid controlled valve V1 such that pressurized air is applied to the air cylinder 32 through the flexible hose 36. Now the piston rod 31 is moved outward from the air cylinder 32 to raise the support 22 and the bonding tool 21 to lift the beam-leaded device 14 from the surface of the work support 56. Finally, the cam 111 closes an associated switch 111' to operate a relay 121 through a circuit including the relay 116. The relay 121 closes a contact 121' to operate the solenoid valve V2 such that pressurized air is applied to the air cylinder 66 through the flexbile hose 72. The piston rod 68 is moved outward from the air cylinder 66 to move the carriage 52 to the left to position the base 58 and the substrate 12 in alignment with the bonding tool 21. At the same time, the relay 116 opens its associated contact 116' to deenergize the motor 107 and the relay 114.

When the carriage 52 moves to its extreme leftward position, thereby locating the substrate 12 directly beneath the bonding tool 21, the plunger 74 is engaged and depressed to close the switch 73. The switch 73 remains closed as long as the carriage 52 is located in its extreme leftward position. Closure of switch 73 energizes relay 113 through a normally closed contact 123 (associated with a delay relay 122) to close its associated contact 113' and operate the solenoid valve V1 such that pressurized air is applied to the air cylinder 32 through the flexible hose 34. Thus, the piston rod 31 is drawn into the air cylinder 32 and the bonding tool 21 is moved downward toward the base 58. The beam-leaded device 14 is positioned upon the substrate 12 with its leads 16 overlying the conductive areas 13, and the bonding of the leads 16 is initiated.

When the beam-leaded device 14 is moved into contact with the substrate 12, the plunger 59 is depressed by the plunger 62 to close the switch 61 and energize a relay 129 through a normally closed contact 126. The switch 98 is not operated at this time since the surface 78 of the base 58 is located at a higher level than the surface of the work loading support 56 and the downward movement of the support 22, by the air cylinder 32 and piston rod 31, is not sufficient to operate the plunger 99. The energized relay 129 closes an associated contact 129' to operate the solenoid valve V4 to apply pressurized air through the flexible hose 47 to the bellows 44. It should be noted that pressurized air is continuously supplied to the bellows 44 as long as the switch 61 and the contact 126 associated with the delay relay 122 remain closed.

Figure 6:
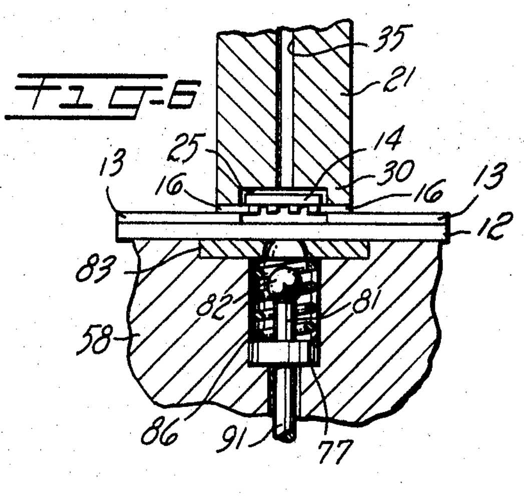
FIG. 6 shows the bonding tip and the beam-leaded device lowered into contact with the substrate at a time when the ball is out of engagement with the substrate.

The pressurized air applied to the bellows 44 moves the pin 46 into engagement with the force transmitting pin 43 extending from the projecting portion 42 of the arm 38. This applies a downward force to the support 22 through the pressure applying pin 41 which is transmitted to the leads 16 and the substrate 12 through the rim 30 of the bonding tool 21 (FIG. 6). As the pressure within the bellows 44 increases, a steadily increasing bonding force is applied to the leads 16. As the bonding force increases, the leads 16 are deformed and, due to the combination of heat and pressure, there is a flow of lead material away from the bonding rim 30 toward the center of the bonding tip. This flow of material forces the beam-leaded device 14 to rise within the recessed portion 25.

As shown in FIG. 4, the plunger 49 of the pressure responsive switch 48 extends into the interior of the bellows 44. The pressure within the bellows 44 produces a force on the plunger 49 which tends to move the plunger 49 outward from the bellows 44 against the urging of a spring 50. The plunger 49 is provided with three projecting arms which operate associated contacts **50*a*, 50*b*, and 50*c* within the pressure responsive switch 48. The projecting arms are arranged such that the contact 50*a* is closed when the total bonding force applied to the leads 16 reaches a first predetermined value, such as six pounds. Similarly, the contact 50*b* is closed when the bonding force reaches a second predetermined force, e.g. fourteen pounds, and the contact 50*c*** is closed when the bonding force reaches a third predetermined value, e.g. eighteen pounds.

Figure 7:
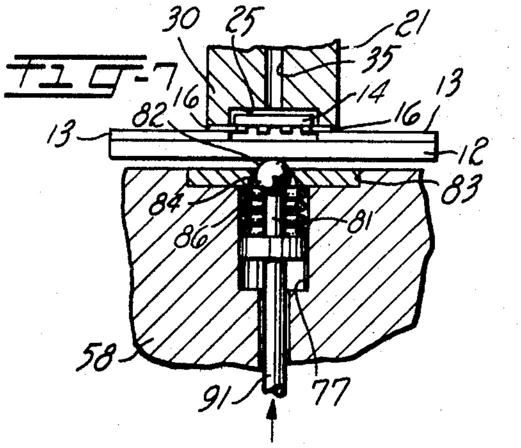
FIG. 7 shows the ball in a raised position pivotally supporting the substrate.

When the pressure within the bellows 44 reaches a first predetermined value (six pounds total force on the leads 16), the contact **50*a* is closed to operate the relay 118. The relay 118 opens its associated contact 118' to deenergize the relay 117, whereby its associated contact 117' is opened and the valve V5 is turned off. Thus, the suction or vacuum force applied through the passageway 35 to the beam-leaded device 14 is released. If the vacuum were not released at this time, an undesirable upward force would be applied to the beam-leaded device 14 producing further deformation of the leads 16 and tending to shear the leads 16** from the beam-leaded device 14. When the pressure within the bellows 44 is increased to a second predetermined value (fourteen pounds force on the leads 16), the contact 50*b* is closed and a relay 131 is operated. A contact 131′ associated with relay 131 is closed to operate the solenoid valve V3 such that pressurized air is applied to the air cylinder 87 through the flexible hose 89. The piston rod 91 is moved outward from the air cylinder 87 to raise the plunger 81 and the ball 82 against the bias of the spring 86. The ball moves upward into the opening 84 in the plate 83 and into substantially point engagement with the bottom surface of the substrate 12. Thus, in practicing the method of the invention, the substrate 12 is lifted (e.g. 1/16 inch) from the top surface 78 (FIG. 7) to break the effective vacuum hold-down force applied through the passages 92. Further, in accordance with the method of the invention, the substrate 12 is pivotally supported by the curved surface of the ball 82 at a tangent point which is directly opposite the beam-leaded device 14 and at the center of the bonding rim 30 and centrally located relative to the lead array. The substrate 12 may pivot universally over the surface of the ball 82 until it reaches an equilibrium position where the bonding forces applied to the leads 16 are equalized. At this time, the total bonding force applied to the bonding tool 21 is evenly distributed over the leads 16.

The pressure within the bellows 44 further increases to a third predetermined value at which the bonding force applied to the leads 16 is eighteen pounds (approximately 1.1 pounds per lead). At this time, the contact 50*c* is closed to operate a commercially available delay relay 122. After a predetermined time period (e.g., approximately 3 seconds) during which the bonding of the leads 16 is completed, the delay relay 122 operates its associated contacts 123–127, inclusive. The contact 127 is closed to operate a relay 132. The relay 132 closes an associated contact 132′ to operate the solenoid valve V3 such that pressurized air is applied to the air cylinder 87 through the flexible hose 88. The pressurized air draws the piston rod 91 into the air cylinder 87 and moves the ball 82 downward out of engagement with the substrate 12 into the counterbore 77. At the same time, the contact 126 is opened to deenergize the relay 129 which turns off the valve V4 by releasing the contact 129′ so that pressurized air is no longer applied to the bellows 44. The contact 123 is opened to deenergize the relay 113 and the contact 124 is closed to energize the relay 119 which closes the contact 119′ to operate the valve V1 to apply pressurized air to the air cylinder 32 through the hose 36. This raises the bonding tool 21 away from the base 58 to its initial position. The contact 125 is closed to operate a delay relay 133. After a predetermined time period (e.g. approximately one second), the relay 133 closes an associated contact 133′ to operate the solenoid valve V2 such that pressurized air is applied to the air cylinder 66 through the hose 71. The piston rod 68 is drawn into the air cylinder 66 and the carriage 52 is moved rightward to its initial position on the frame 28. At this time, the operation of the bonding apparatus is completed and the bonding tool 21 and the carriage 52 are in their initial positions on the bonding apparatus. The switches 48 and 61 are unoperated so that the relays of the control circuit are deenergized. Thus the bonding apparatus and control circuit are prepared for the initiation of another bonding cycle.

It should be noted that in the operation of the bonding apparatus, electrical energy is continuously applied to the heating cartridge 96 through the leads 97. A resistor within the cartridge 96 converts the electrical energy into heat energy which is used, together with pressure, to bond the leads 16 to the conductive areas 13 on the substrate 12 in the bonding technique known as "thermocompression bonding." Sufficient electrical energy is applied to the cartridge 96 to maintain the bonding tool 21 at a constant temperature between 350° C. and 400° C. It should also be noted that the vacuum force applied to the substrate 12 through the passages 92 is also continuously applied, but is relatively small so that the ball 82 can lift the substrate 12 from the top surface 78 without difficulty.

Figure 8:
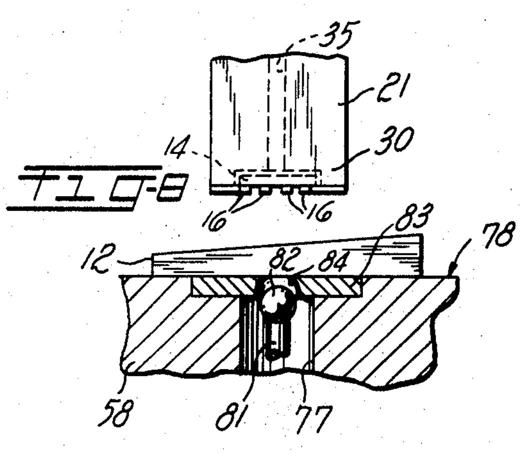
FIGS. 8–10 illustrate the operation of the bonding tool and the movable ball in compensating for nonuniformity in the thickness of a substrate.
Figure 9:
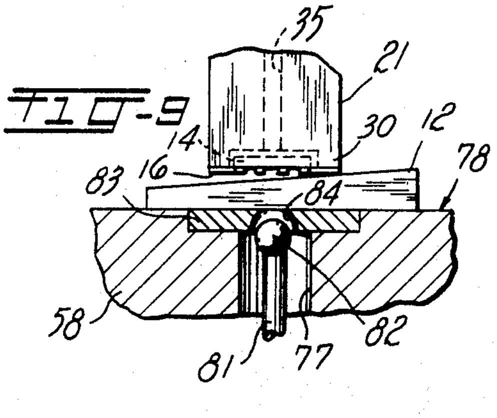
Figure 10:
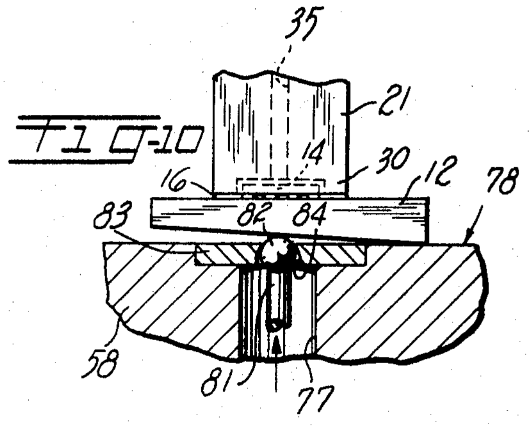

The method of the present invention is utilized to compensate for surface irregularities and nonuniformity in the thickness of a substrate 12. FIGS. 8–10 illustrate the operation of the bonding apparatus in compensating for variation in the thickness of a substrate 12. For purposes of illustration, the nonuniformity in the thickness of the substrate 12 is greatly exaggerated. In FIG. 8, the bonding tool 21 is shown as it approaches the substrate 12. A beam-leaded device 14 is held within the recessed portion 25 by a vacuum applied to the passageway 35, and the leads 16 of the beam-leaded device 14 are held firmly against the rim 30 of the bonding tip. At this time, the ball 82 is located beneath the top surface 78 of the base 58 and out of engagement with the substrate 12.

When the bonding tool 21 moves sufficiently downward to bring the leads 16 of the beam-leaded device 14 into contact with the substrate 12 (FIG. 9), the leads 16 located on the right side of the bonding rim 30 are first to engage the substrate 12 because of the nonuniformity in the thickness of the substrate 12. As the force applied to the bonding tool 21 is increased, the bonding rim 30 exerts bonding forces on all the leads 16, but the bonding forces are unevenly distributed over the leads 16 because of the nonuniform substrate thickness.

When the total bonding force applied to the leads 16 reaches a value of fourteen pounds, the plunger 81 is moved upward to raise a portion of the ball 82 above the top surface 78. The arcuate surface of the ball moves into engagement with the bottom of the substrate 12 and lifts the substrate 12 above the top surface 78. The bonding tool 21 is also raised by the upward movement of the ball 82, but no increase in the bonding force results because the bellows represent a constant force system. The substrate 12 pivots over the arcuate surface of the ball 82 until it reaches an equilibrium position (FIG. 10) where the bonding force applied to the bonding tool 21 is evenly distributed over the leads 16. As described above, the bonding force is increased to eighteen pounds and bonding is then continued for approximately three seconds during which the same bonding force (approximately 1.1 pounds) is applied to each lead 16. In this manner, the operation of the bonding apparatus results in uniform bonding between the leads 16 and the conductive areas 13 of the substrate 12.

In addition to compensating for nonuniformity in the thickness and surface irregularities of a substrate, the method of the present invention can accommodate substrates having other types of irregularities. For example, the bonding method can be used to apply uniform bonding pressure to the leads of a beam-leaded device which are to be bonded to a substrate that is slightly warped. In fact, the method can be used to distribute bonding forces in any situation where the substrate surface is not initially parallel to the surface of the bonding rim 30.

Although the embodiments of the present invention described above relates to automatic bonding, it is obvious that the apparatus can be modified to facilitate manual operation. By eliminating the air cylinders and the control circuit switches, and replacing them with manually operated devices for raising and lowering the bonding tool 21, for moving the carriage 52 horizontally, and for lifting the ball 82 into engagement with the substrate 12, a bonding apparatus capable of manual operation is obtained.

The bonding method described above is merely illustrative of the principles of the present invention and modifications in the bonding method and in the operating sequence can be made by persons having ordinary skill in the art without departing from the scope of the invention. The concept of compensating for nonuniform thickness in a substrate to which workpieces are to be bonded is not limited to an apparatus which performs thermocompression bonding. For example, the above-described apparatus can be modified for use in vibratory and ultrasonic bonding techniques.

What is claimed is:

1. A method of bonding a first array of leads to a second, similar array of leads, which comprises:
 moving the first and second arrays of leads into engagement with each other,
 applying bonding forces to said engaged first leads at areas spaced about a common point, and then
 applying a supporting force through said common point to said second leads to equalize the bonding forces between said first and second leads during application of said bonding forces.

2. A method of bonding a first planar array of leads, extending from a device, to a second, like array of conductors on a substrate, which comprises:
 positioning the device on the substrate with the first array of leads overlying the second array of conductors,
 applying bonding energy to the leads at areas spaced about a point centrally located relative to the lead array to exert bonding forces on the leads and conductors, and then
 applying a supporting force to the substrate through said centrally located point and in a direction substantially perpendicular to said planar array of leads to pivotally support said substrate to obtain uniform distribution of the bonding forces over said leads and conductors.

3. A method of bonding an array of leads, extending from a device, onto a like array of conductors on a substrate, wherein the bonding is performed by a tool having a peripheral bonding rim surrounding an area for receiving the device, which comprises:
 supporting the substrate on a flat surface with the conductors exposed and the underside of said substrate in contact with said flat surface;
 holding the device on said tool with the leads projecting over said peripheral rim;
 moving said tool to advance said leads into engagement with said conductors;
 applying a force to a point on the underside of said substrate, which point is within the area defined by said peripheral rim, to lift the substrate from said flat surface and urge all of said conductors into engagement with said leads with equal forces; and
 applying bonding energy to said tool and rim to bond said leads to said conductors.

References Cited

UNITED STATES PATENTS

| | | | |
|---|---|---|---|
| 3,403,438 | 10/1968 | Best et al. | 29—470 |
| 3,382,564 | 5/1968 | Gallentine | 29—471 |
| 3,289,046 | 11/1966 | Carr | 29—589 |
| 3,255,511 | 6/1966 | Weissenstern et al. | 29—497 |
| 3,002,271 | 10/1961 | Thornton | 29—589 XR |

JOHN F. CAMPBELL, Primary Examiner

R. B. LAZARUS, Assistant Examiner

U.S. Cl. X.R.

29—470.1, 471.1, 493.0, 497.5, 628